United States Patent [19]

Smith

[11] 4,446,534

[45] May 1, 1984

[54] PROGRAMMABLE FUSE CIRCUIT

[75] Inventor: Frederick J. Smith, Cupertino, Calif.

[73] Assignee: National Semiconductor Corporation, Santa Clara, Calif.

[21] Appl. No.: 214,400

[22] Filed: Dec. 8, 1980

[51] Int. Cl.³ .............................................. G11C 8/00
[52] U.S. Cl. ..................................... 365/96; 365/104; 365/200; 365/230; 307/202.1
[58] Field of Search ................ 365/96, 104, 200, 230; 340/825.84; 307/202.1

[56] References Cited

U.S. PATENT DOCUMENTS 3,845,476  10/1974  Boehm ................................ 365/200
4,122,540  10/1978  Russell et al. ...................... 365/200

Primary Examiner—James W. Moffitt
Attorney, Agent, or Firm—Gail W. Woodward; Paul J. Winters; Michael J. Pollock

[57] ABSTRACT

A programmable fuse circuit has a fusable polysilicon element programmable in response to an "illegal" condition on existing pins of an integrated circuit. This programmable fuse circuit is incorporated in a programmable partial memory circuit, a reconfigurable format memory circuit, and a chip select circuit.

6 Claims, 9 Drawing Figures

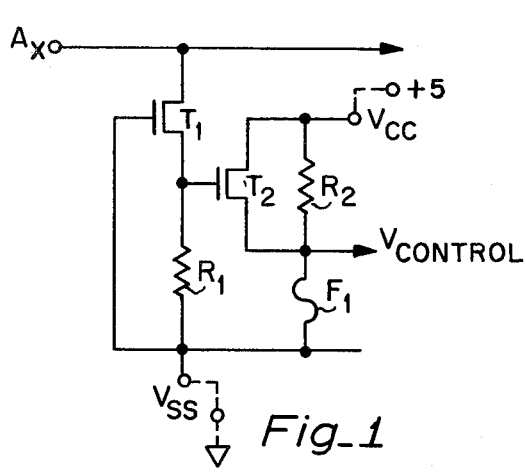
Fig_1
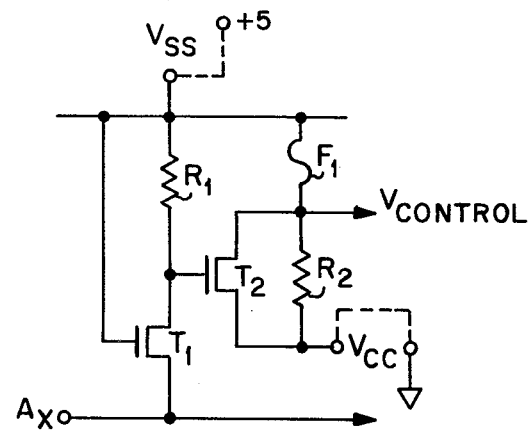
Fig_2
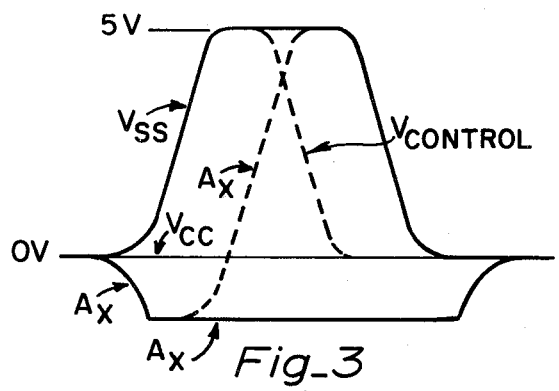
Fig_3
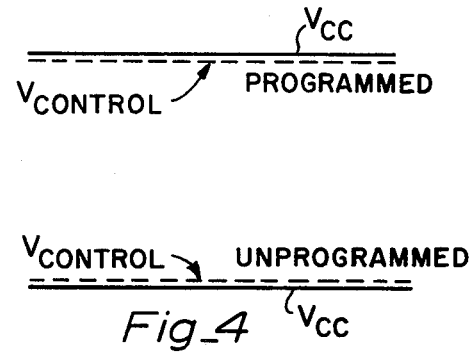
Fig_4
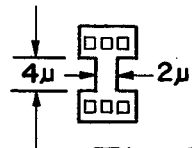
Fig_9
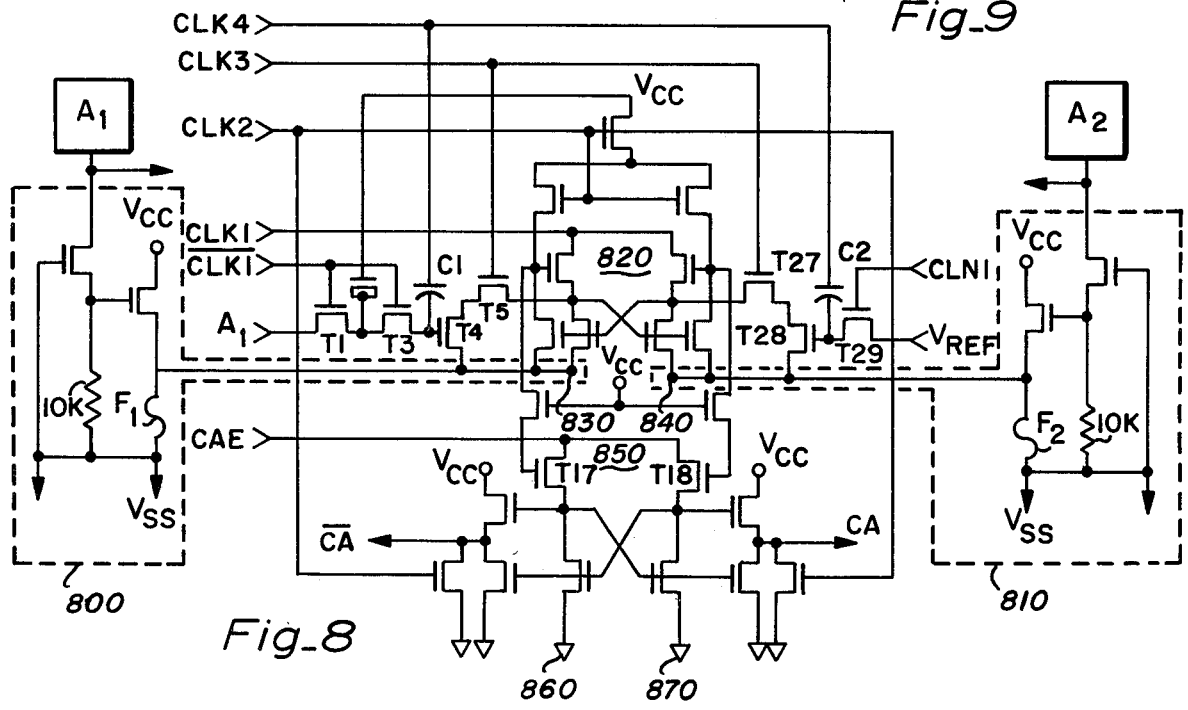
Fig_8

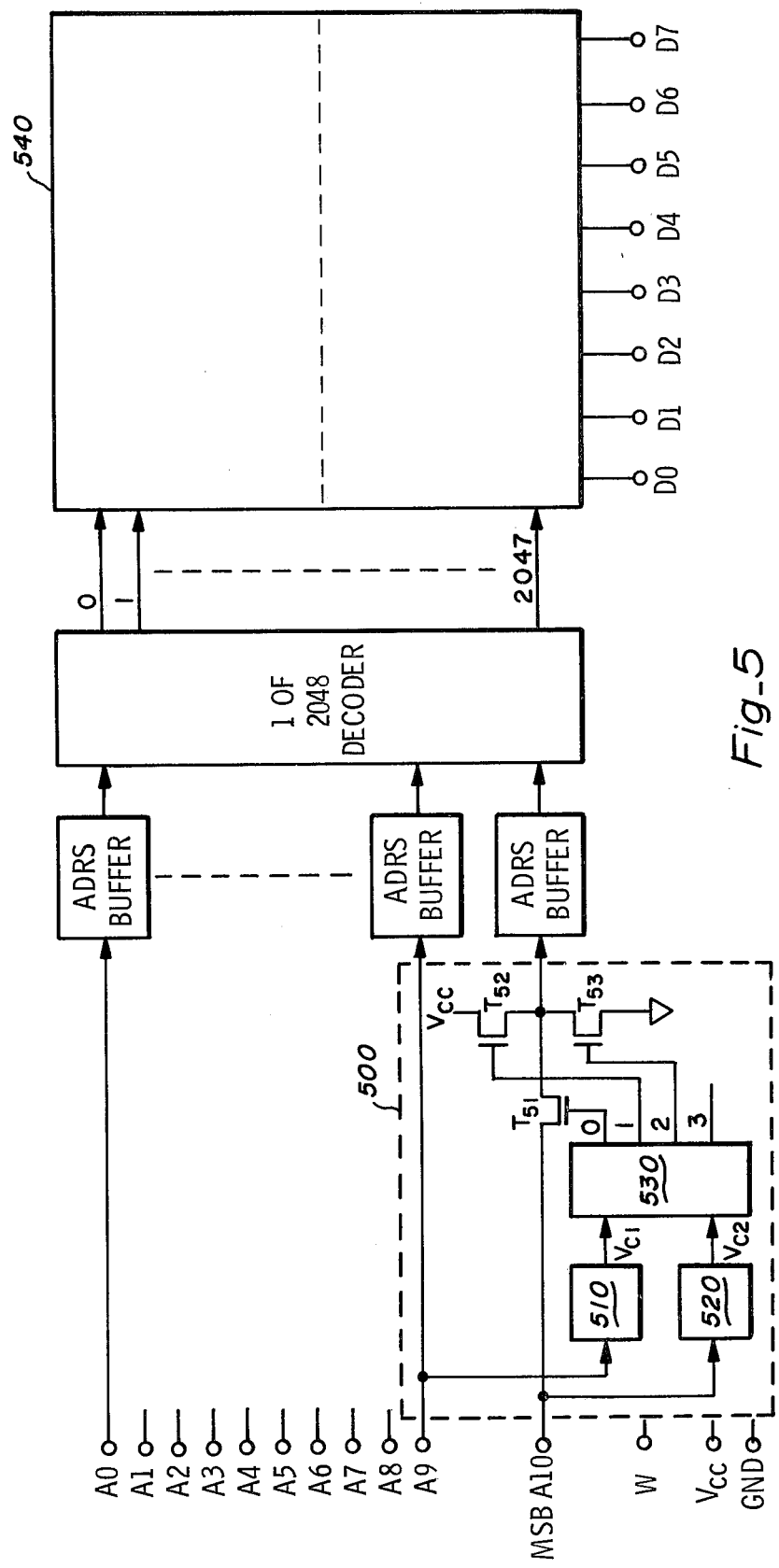
Fig_5

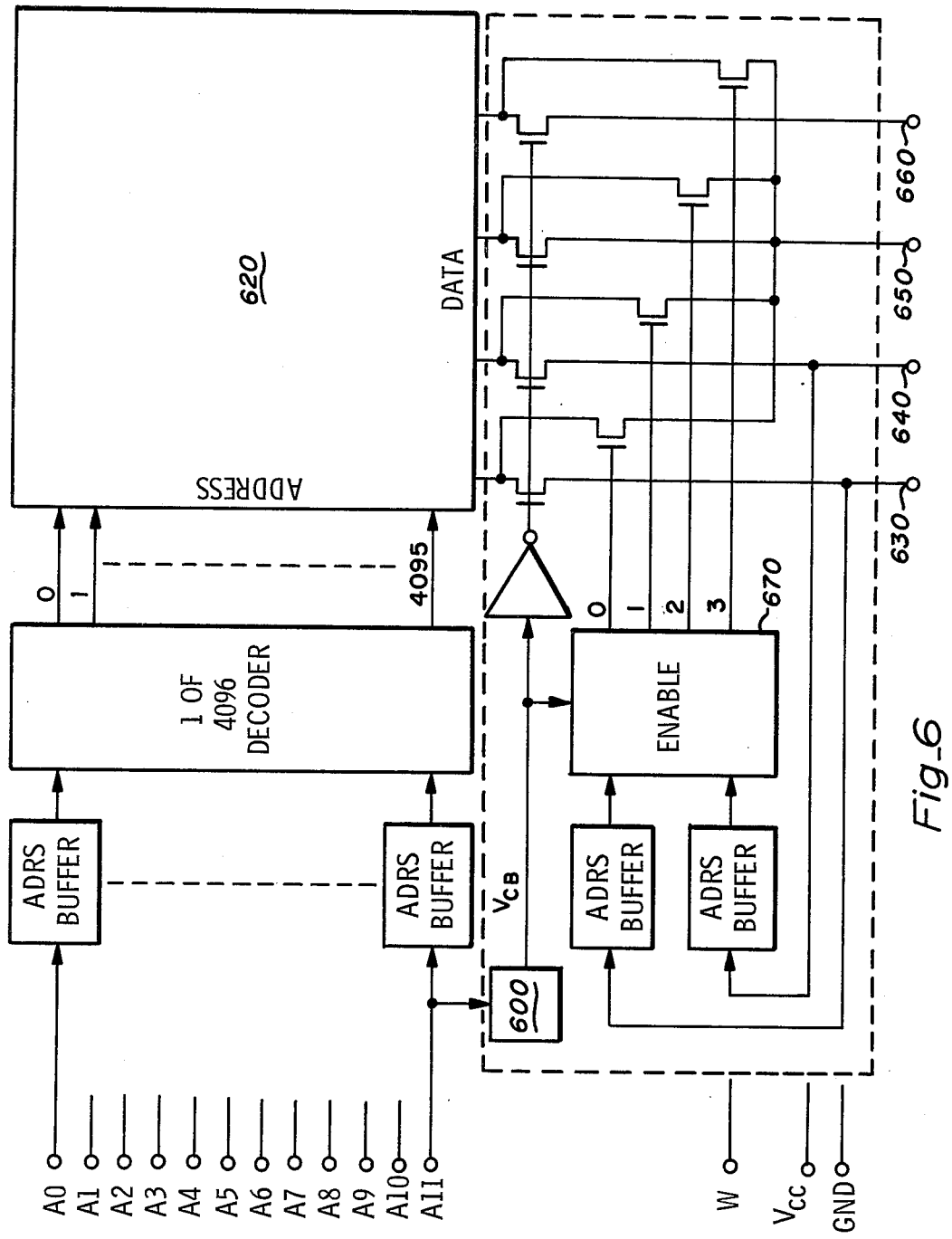
Fig_6

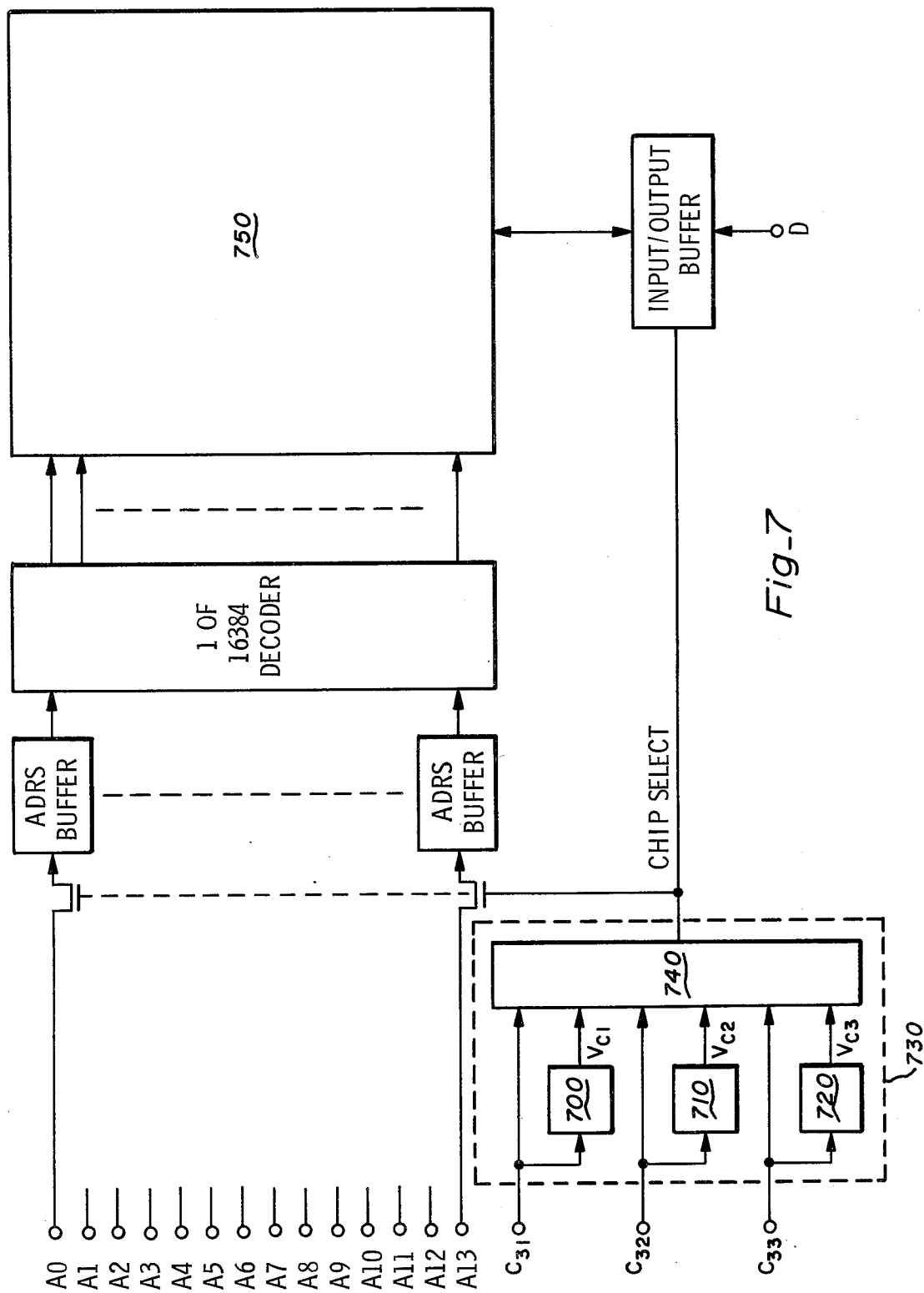
Fig_7

PROGRAMMABLE FUSE CIRCUIT

BACKGROUND OF THE INVENTION

1. Field of the Invention

The present invention relates to the field of programmable fuse circuits. More specifically, the present invention relates to a programmable fuse circuit which allows a packaged integrated circuit to be programmed without the need for an extra package pin to control the programming function.

2. Brief Description of the Prior Art

It is common in the manufacture of the integrated circuit memories to have a defect occur in one portion of the memory array. It is desirable to use the functional portion of these memories as partial memories having total memory sizes smaller than the size of the original memory. Specifically, 8K Rams having defects in one portion of their memory array can often be used as 4K RAMS. However, it is necessary to specify which pin or which side of the partially functional memory is defective so that only the functional side of the memory array is used. Typically it is necessary to specify that one of the address pins of the partially functional memory is to be held at a specific voltage level to select the functional portion of the memory array.

In another type of semiconductor circuit a metal mask option can be applied as the last step in the manufacture of a semiconductor memory to provide connections which selectively activate desired circuit functions. For example, by proper design of the memory circuitry and the interconnects formed by the metal mask options, the memory can be selectively configured in either a 1K by 4-bit format or a 4K by 1-bit format. However, it would be desirable to be able to make a single part which could be selectively programmed to the desired memory format without the need for alternative metal masks. This would eliminate the need for separate metal masks and the need to inventory either partially completed memory circuits or two different types of memory circuits.

Similarly, mask options are often used to code select addresses into comparators of memories with multiple chip-select inputs. However, this requires the sorting and separate storing of memories programmed with each of the possible chip addresses. Again, it is desirable to have a single memory circuit which can be programmed to have any of the desired chip select addresses.

SUMMARY OF THE INVENTION

The preferred embodiment of the present invention has a transistor fuse circuit adapted to selectively program a fuse and a corresponding output signal in response to a reversal of the polarity of the power supply inputs. In the preferred alternative embodiment, this fuse circuit is incorporated in a programmable partial memory circuit which is programmed to address only selected addresses of a partially functional memory chip. In another preferred alternative embodiment the fuse circuit may be incorporated in a reconfigurable memory circuit which is programmable to reformat input and output lines. For example, the fuse circuit may be used to reformat a memory circuit normally having a 4-bit parallel output so that two of the original data lines are used as address inputs to select one of the four output bits, converting the memory to a one-bit output format with two additional address lines. Finally, in yet another preferred alternative the fuse circuit may be incorporated in a chip select circuit for selectively activating a designated circuit in response to selected chip address signals.

BRIEF DESCRIPTION OF THE FIGURES

FIG. 1 is a detailed schematic diagram of a programmable fuse circuit in accordance with the preferred embodiment of the present invention.

FIG. 2 is a detailed schematic diagram of the programmable fuse circuit of FIG. 1. The circuit has been inverted to illustrate the inversion of the voltages applied to terminals $V_{SS}$ and $V_{CC}$.

FIG. 3 is a waveform diagram illustrating the signals used to program the programmable fuse circuit of FIGS. 1 and 2.

FIG. 4 is a waveform diagram illustrating signals and voltages characteristic of the normal circuit operation of the programmable fuse circuit of FIGS. 1 and 2.

FIG. 5 is a block diagram of a partial memory select circuit having programmable fuse circuits for selecting active portions of the memory.

FIG. 6 is a block diagram of a reconfigurable memory select circuit having a programmable fuse circuit for selecting memory input/output format.

FIG. 7 is a block diagram of a chip select circuit having three programmable fuse circuits.

FIG. 8 is a detailed schematic diagram of a partial memory select circuit.

FIG. 9 is a dimensional view of a polysilicon fuse.

DETAILED DESCRIPTION OF THE PREFERRED EMBODIMENT

FIG. 1 is a detailed schematic diagram of a programmable fuse circuit in accordance with the preferred embodiment of the present invention. A voltage supply terminal $V_{SS}$, preferably coupled to an operating voltage equal to ground, is coupled to the gate of a transistor T1, one terminal of resistor R1 and one terminal of a polysilicon fuse F1. The other terminal of resistor R1 is coupled to a gate of a transistor T2 and to a first terminal of transistor T1. The other terminal of transistor T1 is coupled to an address line $A_X$. The other terminal of polysilicon fuse F1 is coupled to a first terminal of transistor T2 and a first terminal of resistor R2. This terminal provides an output control signal which is the programmable control signal generated by the programmable fuse circuit. The other terminal of transistor T2 and the other terminal of resistor R2 are coupled to a voltage supply terminal $V_{CC}$, which is preferably coupled to an operating voltage equal to 5 volts.

In the preferred embodiment of the present invention resistor R1 is 10K ohms, resistor R2 is 1M ohm, transistor T1 is an N-channel field effect transistor having a width to length ratio (W/L) of 100/4, transistor T2 has a W/L=400/4, and polysilicon fuse F1 has a resistance of 50 ohms. Further, polysilicon fuse F1 has a current handling capability of approximately 10 milliamps and blows, causing an open circuit, if a larger current is applied for more than approximately 1 second.

In the normal mode of operation, terminal $V_{SS}$ is coupled to a ground voltage and terminal $V_{CC}$ is coupled to a positive voltage of approximately five volts. In this mode, transistors T1 and T2 are both nonconductive. The level of output control signal is determined by the ratio of the resistances of resistor R2 and fuse F1. The resistance of resistor R2 is approximately 1M ohm and the resistance of the fuse $F_1$ is approximately 50 ohms. Thus, in this "unprogrammed" state, the output control signal is approximately equal to the ground voltage applied to terminal $V_{SS}$. In the normal mode of circuit operation an address signal is applied to address line $A_X$. This address signal is unaffected by the programmable fuse circuit.

In some applications it is desirable to program the level of the output control signal $V_{CONTROL}$. In the present invention, the output control signal $V_{CONTROL}$ is programmed by applying a normally illegal condition to the inputs of the programmable fuse circuit. Specifically, as illustrated in the detailed schematic diagram FIG. 2 the power supply voltages are inverted, a voltage of approximately five volts is applied to terminal $V_{SS}$ and terminal $V_{CC}$ is coupled to ground. Address line $A_X$ is brought a few volts negative to insure that transistor T1 turns on as soon as the voltage on terminal $V_{SS}$ goes positive to avoid any possible programming errors.

This sequence of signals is shown in waveform diagram FIG. 3. The voltage applied to terminal $V_{SS}$ is raised to a voltage of approximately five volts. To progam the fuse a voltage of approximately 5 volts is applied to address line $A_X$. The application of a five volt address signal to address line $A_X$ and the application of a five volt signal on terminal $V_{SS}$ causes the gate of transistor T2 to charge to 5 volts, enabling transistor T2 and causing it to conduct an additional current through polysilicon fuse $F_1$. Transistor $T_2$ has an on resistance of approximately 75 ohms which draws an additional current through polysilicon fuse $F_1$ of approximately 40 milliamps. Polysilicon fuse F1 is designed to blow at a current of approximately 20 millamps. This, causes transistor T1 to conduct which results in an open circuit between terminal $V_{SS}$ and terminal $V_{CONTROL}$. This results in an output control signal having a voltage of approximately 5 volts, the voltage normally applied to terminal $V_{CC}$, in a subsequent normal mode of circuit operation.

FIG. 4 is a waveform diagram of signals and supply voltages characteristic of the normal operation of the preferred embodiment of the present invention. A supply voltage of preferably five volts, is applied to terminal $V_{CC}$ and a supply voltage of 0 volts is applied to terminal $V_{SS}$. The output control signal provided by the programmable fuse circuit on terminal $V_{CC}$ is approximately equal to the voltage applied to terminal $V_{CC}$ if the circuit has been programmed, that is, if polysilicion fuse F1 has been blown, and is approximately equal to the voltage applied to terminal $V_{ss}$ if the circuit has not been programmed.

In the preferred embodiment of the present invention, the substrate of the circuit is floating or is coupled to a terminal separate from terminals $V_{ss}$ and $V_{cc}$. It should be noted that present embodiment of the present invention does not program properly if the substrate is coupled to terminal $V_{ss}$.

One use of the preferred embodiment of the present invention is in the selection of partial memories by selectively programming programable fuse circuits. A block diagram of a partial memory select circuit 500 is illustrated in FIG. 5. As illustrated, output control signals $V_{C1}$ and $V_{C2}$ provided by programmable fuse circuits 510 and 520 are logical zeros if the polysilicon fuses of programmable fuse circuits 510 and 520 are intact and logical ones if the polysilicon fuses are blown. Partial memory select circuit 500 has three different states depending on the status of the output control signals provided by programmable fuse circuits 510 and 520. Table 1 illustrates the values of the output control signals and the corresponding output of a one-of-four decoder 530. If the output of decoder 530 is equal to a zero, corresponding to output line 0 having a high voltage level, transistor T51 is conductive and the most significant bit address line A10 is coupled to memory 540 and memory 540 is configured as fully functional memory having a capacity of 2,048×8-bits. If the signal on the 1 output line of decoder 530 is a high voltage, transistor T52 is conductive, a high voltage is applied to address line A10, and memory 540 is coupled as a partial memory where the "bottom" 1024×8-bits, corresponding to A10=a logical one, are addressed in response to signals on address lines A0–A9. If the signal on the 2 output line of decoder 530 is a high voltage, transistor T53 is conductive, a ground voltage is applied to address line A10, and memory 540 is coupled as a partial memory where the "top" 1,024×8-bits corresponding to A10=a logical 0, are addressed in response to signals on address lines A0–A9.

TABLE 1

| VC1 | VC2 | Decoder 530 Output |
|-----|-----|--------------------|
| 0   | 0   | 0                  |
| 0   | 1   | 1                  |
| 1   | 0   | 2                  |
| 1   | 1   | 3                  |

The condition where the signal on the 3 output of decoder 530 is a high voltage in an unused state.

FIG. 6 is a block diagram illustrating the use of a programmable fuse circuit 600 in a reconfigurable memory select circuit 610. Specifically, if the value of output control signal $V_{CB}$ is a logical zero, a memory 620 is configured in a format of 4,096×4-bits. That is, a memory having 4,096 4 bit memory locations. If programmable fuse circuit 600 is programmed so that control bit $V_{CB}$ is a logical one, then memory 620 is configured in a format of 16,384×1-bit. It should be noted that in the 4K×4 bit format terminals 630, 640, 650 and 660 are all input/output data terminals. However, in the 16K×one bit embodiment, terminals 630 and 640 are both used as additional address input terminals, terminal 650 is used as a data input/output terminal and terminal 600 is no longer functional. Specifically, 1 or 4 decoder 670 multiplexers one of the 4 data bits from memory 620 onto terminal 650 in response to the values of signals applied to terminals 630 and 640 and an output control signal on line $V_{CB}$ corresponding to a logical one.

FIG. 7 is a block diagram illustrating three programmable fuse circuits 700, 710 and 720 implemented in a chip select circuit 730. Chip select circuit 730 compares signals on input terminals $C_{S1}$, $C_{S2}$ and $C_{S3}$ against a previously programmed code. Specifically, if the input signals applied to terminals $C_{S1}$, $C_{S2}$ and $C_{S3}$ match the output control signals $V_{C1}$, $V_{C2}$ and $V_{C3}$ provided by programmable fuse circuits 700, 710 and 720, comparator 740 will provide a chip select signal and 16K memory array 750 will be actively coupled so as to be responsive to signals on address lines $A_0$–$A_{13}$ and a data input/output line D. For all other conditions of the signals on terminals $C_{S1}$, $C_{S2}$, and $C_{S3}$ the memory 750 is unresponsive to signals on the address lines.

FIG. 8 is a detailed schematic diagram of an address buffer for the MSB, $A_1$, of an 8K×8 pseudostatic RAM having two programmable fuse circuits in accordance with the preferred embodiment of the present invention. This address buffer can be programmed in response to address signals or address lines $A_1$ and $A_2$ as described above. Address signal $A_1$ and a reference voltage $V_{REF}$ are clocked to a comparison circuit 820 by a series of clocking transistors T1, T3, T4, T5, T29, T28, and T27 under the control of clock signals $\overline{CLK1}$, CLK1, CLK2, CLK3 and CLK4. If polysilicon fuses F1 and F2 are intact, nodes 830 and 840 of comparison circuit 820 are coupled to ground through the 50 ohm polysilicon fuses. If it is desired to force one of the address signals to a logical one or a logical zero, the polysilicon fuses can be selectively blown. For example, if polysilicon fuse F1 is blown, node 830 goes to a high voltage level which forces node 840 to a low voltage level.

The address buffer controls the most significant bit (MSB) of the 8K×8 pseudostatic RAM, thus programming the MSB selects either a top or bottom partial memory having a 4K×8 format. When programmed, the MSB input terminal becomes a "don't care," and only the portion of the memory corresponding to the programmed value of the MSB is operative.

The differential output of comparison circuit 820 is applied to the gates of transistors T17 and T18 which comprise a part of a second latch 850. This second latch is conventional in that the terminals 860 and 870 are grounded. The outputs CA, and $\overline{CA}$, of latch 850 are coupled to the memory circuit to select the MSB of the memory address.

FIG. 9 is an illustration of the polysilicon fuse of the preferred embodiment.

While the invention has been particularly taught and described with reference to the preferred embodiments, those versed in the art will appreciate that minor modifications in form and detail may be made without departing from the spirit and scope of the invention. Accordingly, all such modifications are embodied within the scope of this patent as properly come within my contribution to the art and are particularly pointed out by the following claims.

I claim:

1. A programmable fuse circuit for providing a control signal on a control terminal comprising:
   means for providing a first voltage;
   means for providing a second voltage;
   means for providing an input signal;
   a first transistor having a first terminal coupled to the means for providing an input signal, a gate coupled to the means for providing the first voltage, and a second terminal;
   a first resistor coupled between the second terminal of the first transistor and the means for providing the first voltage;
   a second transistor having a first terminal coupled to the means for supplying the second voltage, a second terminal coupled to the control terminal, and a gate coupled to the second terminal of the first transistor; and
   a fuse coupled between the second terminal of the second transistor and the means for providing the first voltage.

2. A programmable fuse circuit as in claim 1, further comprising a second resistor, having a resistance greater than the resistance of the fuse, coupled between the first and second terminals of the second transistor.

3. A programmable fuse circuit as in claim 1 or 2 wherein the fuse will permanently become an open circuit in response to current flow through the second transistor.

4. A method for programming a programmable fuse circuit as in claim 1 or 2 comprising the steps of:
   providing a ground voltage on the means for providing the second voltage;
   providing a slightly negative voltage on the means for providing the input signal;
   providing a positive voltage on the means for providing the first voltage;
   providing a positive voltage on the means for providing the input signal;
   providing a ground voltage on the means for providing the first voltage; and
   providing a positive voltage on the means for providing the second voltage.

5. A chip select circuit having a plurality of programmable fuse circuits, each programmable fuse circuit comprising:
   means for providing a first voltage;
   means for providing a second voltage;
   means for providing an input signal;
   a first transistor having a first terminal coupled to the means for providing an input signal, a gate coupled to the means for providing the first voltage, and a second terminal;
   a first resistor coupled between the second terminal and the first transistor and the means for providing a first voltage;
   a second transistor having a first terminal coupled to the means for supplying the second voltage, a second terminal coupled to the control terminal, and a gate coupled to the second terminal of the first transistor; and
   a fused coupled between the second terminal of the second transistor and the means for providing the first voltage;
   and further comprising a plurality of select terminals, one corresponding to each programmable fuse circuit, and compare means coupled to the programmable fuse circuits and to the select terminals for providing a chip select signal in response to signal on the input terminals matching the control signals of the corresponding programmable fuse circuits.

6. A selectable memory circuit having a chip select circuit as in claim 5 for providing data signals on the data lines in response to data stored in memory elements in response to address signals applied to address lines and to a chip select signal having a first voltage level and for not providing data signals in response to the chip select signal having a second voltage level.

* * * * *